United States Patent
Hsu et al.

(10) Patent No.: US 6,667,217 B1
(45) Date of Patent: Dec. 23, 2003

(54) METHOD OF FABRICATING A DAMASCENE COPPER INDUCTOR STRUCTURE USING A SUB-0.18 UM CMOS PROCESS

(75) Inventors: Heng-Ming Hsu, Ta-Lie (TW); Jau-Yuann Chung, Richardson, TX (US); Yen-Shih Ho, Ta-Hu (TW); Chun-Hon Chen, Hsin-Chu (TW); Kuo-Reay Peng, Funsung (TW); Ta-Hsun Yeh, Hsin-Chu (TW); Kong-Beng Thei, Hsin-Chu (TW); Ssu-Pin Ma, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 165 days.

(21) Appl. No.: 09/795,115

(22) Filed: Mar. 1, 2001

(51) Int. Cl.$^7$ ............... H01L 21/20; H01L 29/00; H01F 5/00
(52) U.S. Cl. ............... 438/381; 438/382; 438/383; 438/384; 257/531; 336/200
(58) Field of Search ............... 257/531; 438/210, 438/381, 384, 385, 382, 383; 336/200

(56) References Cited

U.S. PATENT DOCUMENTS

| | | | |
|---|---|---|---|
| 4,789,648 A | * 12/1988 | Chow et al. | 216/52 |
| 5,371,047 A | * 12/1994 | Greco et al. | 438/623 |
| 5,629,236 A | 5/1997 | Wada et al. | 438/607 |
| 5,770,509 A | 6/1998 | Yu et al. | 438/381 |
| 5,788,854 A | * 8/1998 | Desaigoudar et al. | 216/13 |
| 5,801,100 A | 9/1998 | Lee et al. | 438/678 |
| 5,869,393 A | * 2/1999 | Tseng | 438/622 |
| 5,960,254 A | 9/1999 | Cronin | 438/14 |
| 6,054,329 A | * 4/2000 | Burghartz et al. | 336/200 |
| 6,133,079 A | * 10/2000 | Zhu et al. | 438/210 |
| 6,159,853 A | * 12/2000 | Lai | 438/653 |
| 6,162,583 A | * 12/2000 | Yang et al. | 430/313 |
| 6,184,138 B1 | * 2/2001 | Ho et al. | 438/687 |
| 6,201,287 B1 | * 3/2001 | Forbes | 257/528 |
| 6,313,003 B1 | * 11/2001 | Chen | 438/148 |
| 6,319,783 B1 | * 11/2001 | Ang et al. | 438/300 |
| 6,329,234 B1 | * 12/2001 | Ma et al. | 257/301 |
| 6,380,079 B1 | * 4/2002 | Lee | 438/626 |

OTHER PUBLICATIONS

Holloway et al. 0.18. mu. CMOS Technology for High–Performance, Low Power, and RF Applications, 1997 Symposium on VLSI Technology Digest of Technical Papers, pp. 13–14.*

* cited by examiner

*Primary Examiner*—Steven Loke
*Assistant Examiner*—Samuel A Gebremariam
(74) *Attorney, Agent, or Firm*—George O. Saile; Stephen B. Ackerman

(57) ABSTRACT

A process for integrating the fabrication of a thick, copper inductor structure, with the fabrication of narrow channel length CMOS devices, has been developed. The integrated process features the use of only one additional photolithographic masking step, used to form the opening in an IMD layer, that will accommodate the subsequent inductor structure. After forming damascene type openings in the same IMD layer, in the CMOS region, copper is deposited and then defined, to result in a thick, copper inductor structure, in the opening in the IMD layer, in a first region of a semiconductor substrate, as well as to result in copper interconnect structures, in the damascene type openings located in a second region of the semiconductor structure, used for the narrow channel length CMOS devices. The use of a thick, copper inductor structure, equal to the thickness of the IMD layer, results in increased inductance, or an increased quality factor, when compared to counterparts formed with thinner metal inductors.

9 Claims, 4 Drawing Sheets

METHOD OF FABRICATING A DAMASCENE COPPER INDUCTOR STRUCTURE USING A SUB-0.18 UM CMOS PROCESS

BACKGROUND OF THE INVENTION (1) Field of the Invention

The present invention relates to methods used to fabricate semiconductor devices, and more specifically to a method used to integrate the fabrication of an inductor structure, and the fabrication of complimentary metal oxide semiconductor, (CMOS), devices.

(2) Description of Prior Art

Impedance matching is needed for radio frequency, (RF), integrated circuits. Inductor structures, comprised of conductive materials are sometimes used to provide the needed impedance matching function. A quality factor, or an inductance quality factor, of the inductor structure, is critical in determining the needed matching function for the integrated circuits. To satisfy process cost objectives, and to integrate with IF band circuit, the fabrication of the needed inductor is usually integrated into the fabrication process used to create the CMOS devices for integrated circuits, such as RF circuits.

This invention will describe a process for fabricating sub-micron, or sub-0.18 um, CMOS devices, in which the formation of the inductor structure is integrating into the CMOS fabrication process, featuring a thick, inductor structure, placed overlying a sub-metal layer. The thick, inductor layer, comprised of copper, is formed using only one additional photolithographic masking step, used to remove insulator layer from the top surface of the underlying sub-metal layer. A damascene process, used to form copper damascene structures, for the CMOS devices, also allows the formation of the thick copper inductor structure, in the opening exposing the sub-metal layer. The increased thickness of this copper layer results in an increased Q factor. Prior art, such as Yu et al, in U.S. Pat. No. 5,770,509, describe processes for forming inductor devices using substrate biasing procedures. That prior art however, does not describe the novel process sequence described in this present invention, in which a thick copper inductor structure, is formed simultaneously with adjacent CMOS devices, featuring the placement of the thick copper inductor structure, directly overlying a sub-metal layer, resulting in a inductor quality factor greater than the quality factor obtained from counterpart, thinner, inductor structures.

SUMMARY OF THE INVENTION

It is an object of this invention to integrate the formation of an inductor structure, into a fabrication process used to fabricate CMOS devices.

It is another object of this invention to form a copper inductor structure, using the same damascene, or a dual damascene process, used for fabrication of the CMOS metal interconnect structures.

It is yet another object of this invention to use one additional masking step, to form an opening in an insulator layer, to accommodate the copper inductor structure, overlaying and contacting, a sub-metal layer.

It is still yet another object of this invention to form a thick, copper inductor structure, to increase the Q, or quality factor of the copper inductor structure.

In accordance with the present invention a method of integrating the formation of a thick, dual damascene, copper inductor structure, with a high Q factor, into a fabrication process used to form sub-0.18 um, CMOS devices, is described, where the term 0.18 um refers to the channel length of an individual CMOS device. After formation of a sub-metal structure, used as a lower level, metal interconnect structure, for CMOS devices, an intermetal dielectric, (IMD), layer is deposited. A first opening is formed in the IMD layer, exposing a first portion of the sub-metal structure, in a region to be used for the copper inductor structure. Dual damascene openings are next formed in the same IMD layer, exposing second portions of the sub-metal layer, in a region to be used for the sub-0.18 um CMOS devices. A copper layer is next deposited, completely filling the first opening, and the dual damascene openings, followed by a chemical mechanical polishing procedure, resulting in copper, dual damascene structures, overlaying and contacting the second portion of the sub-metal layer, and resulting in a copper inductor structure, located in the first opening in the IMD layer, overlaying and contacting the first portion of the sub-metal layer

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
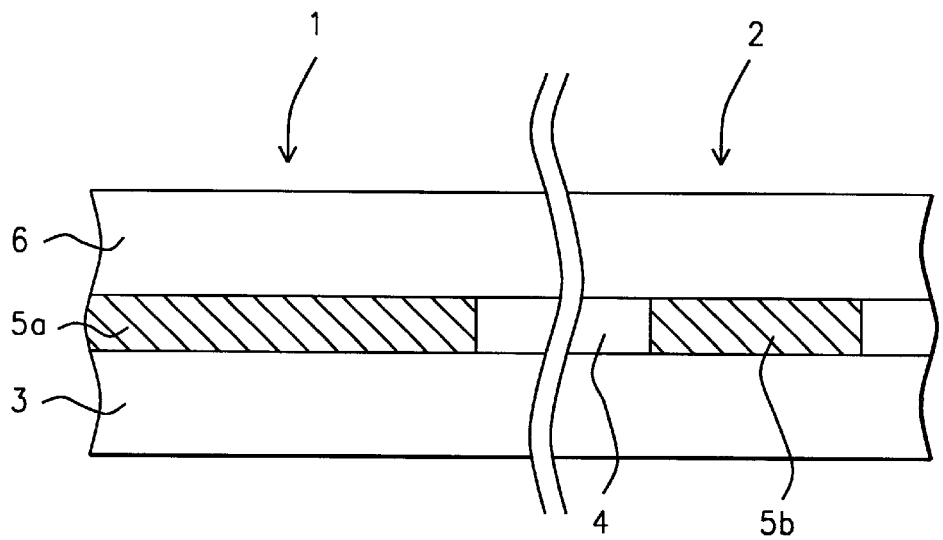
FIGS. 1–5, 6B, which schematically shows, in cross-sectional style, describe key stages of fabrication, used to integrate the formation of a copper inductor structure, into a CMOS device, fabrication process.

The method of integrating the formation of a copper inductor structure, featuring an unproved quality factor, with the formation of narrow channel length, CMOS devices, will now be described in detail. A semiconductor substrate, not shown in the drawings is used, with region 1, of the semiconductor substrate, used for narrow channel, or sub-0.18 um, CMOS devices, and region 2, of the semiconductor substrate, allotted for a subsequent inductor structure. A first, intermetal dielectric layer 3, shown schematically in FIG. 1, is comprised of either silicon oxide, or borophoshosilicate glass, (BPSG), at a thickness between about 6000 to 8000 Angstroms. Openings, not shown in the drawings, are formed in IMD layer 3, exposing underlying conductive regions, such as lower level, metal interconnect structures, in CMOS region 1, or exposing underlying conductive regions, such as lower level metal structures, or regions of semiconductor substrate, in inductor structure region 2. The deposition and patterning of a sub-metal layer, are next addressed resulting in sub-metal structure 5a, in CMOS region 1, overlying, and contacting, lower level metal interconnect structures, while sub-metal structure 5b, is defined in inductor region 2, located on IMD layer 3. Sub-metal structure 5b, is separated from the semiconductor substrate, or from conductive regions that in turn communicate with the semiconductor substrate, by the thickness of IMD layer 3. This is schematically shown in FIG. 1. Sub-metal structures 5a, and 5b, can be comprised of copper, or chosen from a group that includes, copper, aluminum, or tungsten, with the metal layer obtained via plasma vapor deposition, (PVD), or via chemical vapor deposition, (CVD), at a thickness between about 4000 to 5000 Angstroms. The definition of these sub-metal structures is realized via photolithographic and reactive ion etching, (RIE), procedures, using Cl₂ as an etchant. After removal of the photoresist shape, used for definition of the sub-metal structures, via plasma oxygen ashing and careful wet cleans, IMD layer 6, is deposited, via low pressure chemical vapor deposition, (LPCVD), or via plasma enhanced chemical vapor deposition, (PECVD), procedures, at a thickness between about 7000 to 7600 Angstroms. IMD layer 6, schematically shown in FIG. 1, can be comprised of silicon oxide or BPSG, with the thickness of this layer establishing the critical thickness of a subsequent inductor structure.

Figure 2:
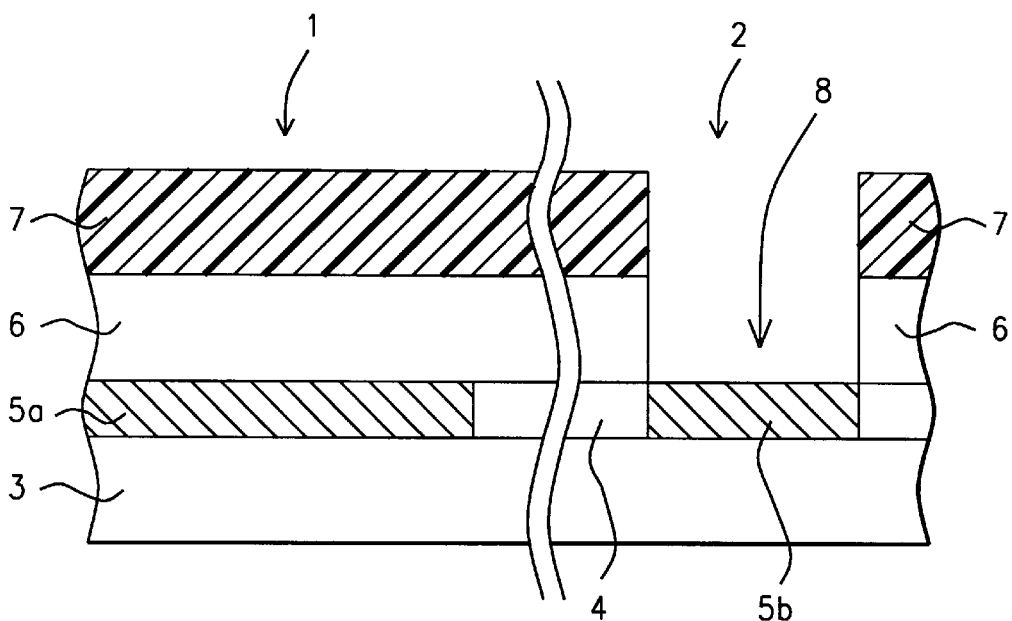

The one additional photolithographic procedure, needed to integrate the fabrication of the inductor structure, in region 2, into the process used to form CMOS devices, in region 1, is next addressed, and schematically described in FIG. 2. Photoresist shape 7, is formed on IMD layer 6, and used as a mask to allow inductor opening 8, to be defined in IMD layer 6. Inductor opening 8, is formed via an anisotropic RIE procedure, using CHF₃ as an etchant, exposing sub-metal structure 5b. The shape of inductor opening 8, can best be seen in FIG. 6A, which will show the subsequent inductor structure, inlaid in opening 8. Photoresist shape 7, is then removed via plasma oxygen ashing and careful wet cleans.

Figure 3:
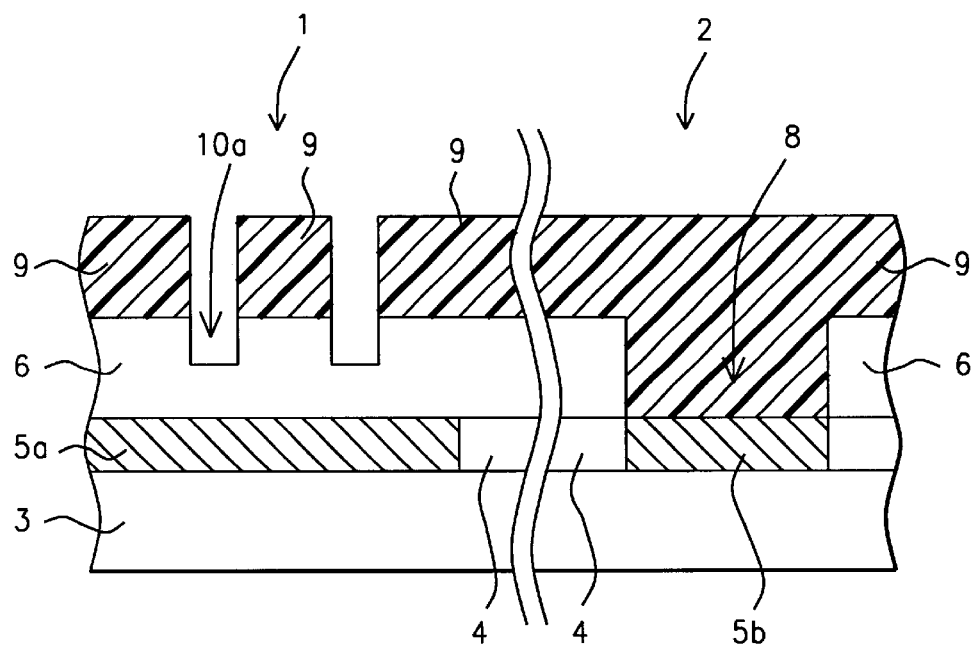
Figure 4:
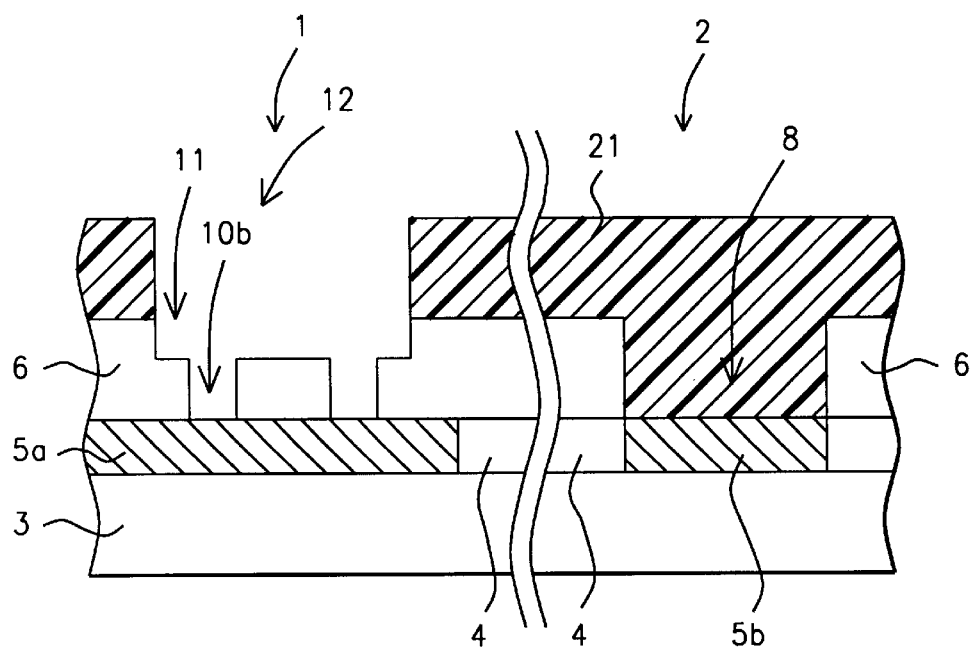

The dual damascene openings, formed in IMD layer 6, exposing regions of sub-metal structure 5a, located in CMOS region 1, are next addressed, and schematically shown in FIGS. 3 and 4. First, photoresist shape 9, is formed, completely covering inductor opening 8, in inductor region 2, with photoresist shape 9, comprised of narrow diameter openings, exposing a portion of the top surface of IMD layer 6, in CMOS region 1. An anisotropic RIE procedure, using CHF₃ as an etchant, is used to form narrow diameter openings 10a, in IMD layer 6. Narrow diameter openings 10a, with a diameter between about 2600 to 3600 Angstroms, can be defined to a depth of between about 6000 to 8000 Angstroms, in IMD layer 6, as schematically shown in FIG. 3, or if desired narrow diameter openings 10a, can be formed to expose portions of the top surface of sub-metal structure 5a. After removal of photoresist shape 9, via plasma oxygen ashing and careful wet cleans, photoresist shape 21, is formed, again completely covering inductor opening 8, while a wide diameter opening, in photoresist shape 21, exposes narrow diameter openings 10a, and exposes a top portion of the unetched IMD layer 6. A selective, anisotropic RIE procedure, again using CHF₃ as an etchant, is than employed to create dual damascene opening 12, in IMD layer 6, comprised of wide diameter opening 11, in a top portion of IMD layer 6, comprised with a diameter larger then 4600 Angstroms, and comprised of narrow diameter openings 10b, formed using narrow diameter openings 10a, as a mask, exposing portions of the top surface of sub-metal structure 5a. The selectivity of IMD layer 6, to the sub-metal structure is greater than 10 to 1, allowing this procedure to stop at the appearance of the sub-metal structure. Photoresist shape 21, is then removed via plasma oxygen ashing and careful wet cleans. If desired dual damascene opening 12, can be replaced by a single damascene opening procedure, with the damascene opening in IMD layer 6, exposing a single portion of the top surface of sub-metal structure 5a, in CMOS region 1.

Figure 5:
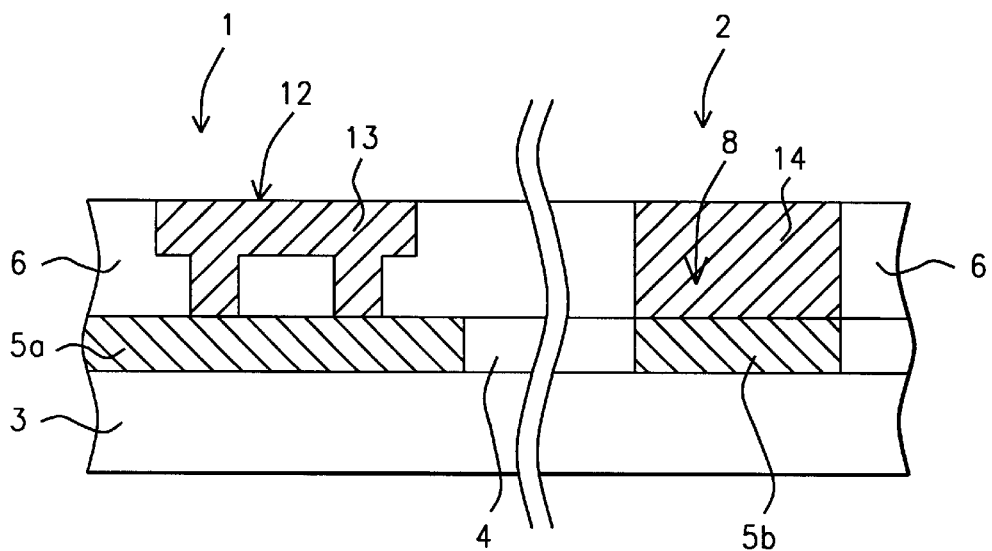

The formation of copper inductor structure 14, in inductor opening 8, as well as the formation of dual damascene copper interconnect structures 13, in dual damascene opening 12, will next be addressed, and schematically shown in FIG. 5. A barrier layer of titanium nitride, not shown in the drawings, is first deposited via PVD procedures, at a thickness between about 200 to 300 Angstroms. The titanium nitride barrier, will prevent copper poisoning of underlying, and adjacent materials, such as IMD layer 6. A thin copper layer, not shown in the drawings, is deposited via PVD or CVD procedures, at a thickness between about 600 to 650 Angstroms, and is used to provide a nucleation layer for an electo-chemical deposited, (ECD), layer, obtained at a thickness between about 8000 to 8500 Angstroms, completely filling inductor opening 8, as well as completely filling dual damascene opening 12. The ECD copper layer is formed via plating conditions, to a thickness between about 8000 to 8500 Angstroms. If desired only the ECD copper layer can be used without the use of the barrier, or nucleation layers. The thickness of the ECD copper layer, for this case is identical to the thickness of ECD copper, used as part of the composite layer. Chemical mechanical polishing is then used to remove regions of the ECD copper layer, regions of the copper nucleation layer, and regions of titanium nitride barrier layer, from the top surface of IMD layer 6, creating copper inductor structure 14, in inductor opening 8, and creating dual damascene copper structure 13, in dual damascene opening 12. If desired a selective RIE procedure, using Cl₂ as an etchant, can be used to selectively remove regions of unwanted material from the top surface of IMD layer 6. The thickness of copper inductor structure 14, related to the thickness of IMD layer 6, results in an improved Q factor, or inductance, for the inductor structure. For example the Q factor, or inductance, for circuits operating at a frequency of about 2 Ghz, for the copper inductor structure with a thickness of about 7300, is about 8, while similar circuits, operating at the same frequency, but using a copper inductor structure at a thickness of only 6300 Angstroms, results in a Q factor of only about 7. If desired other metals, such as tungsten, aluminum, or aluminum based layers, can be used in place of copper.

Figure 6A:
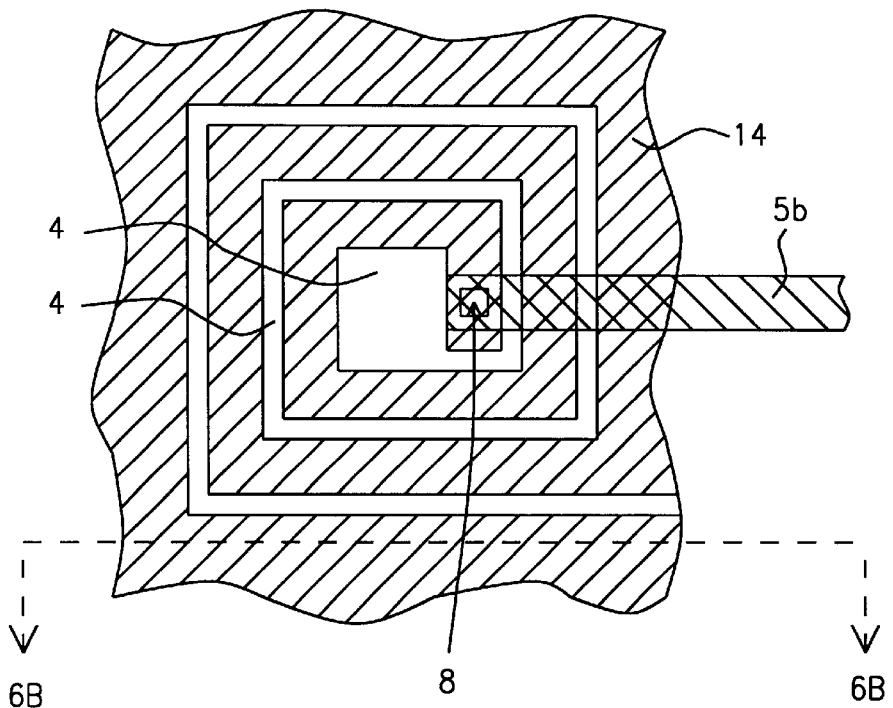
FIG. 6A, which schematically shows the top view of the copper inductor structure.
Figure 6B:
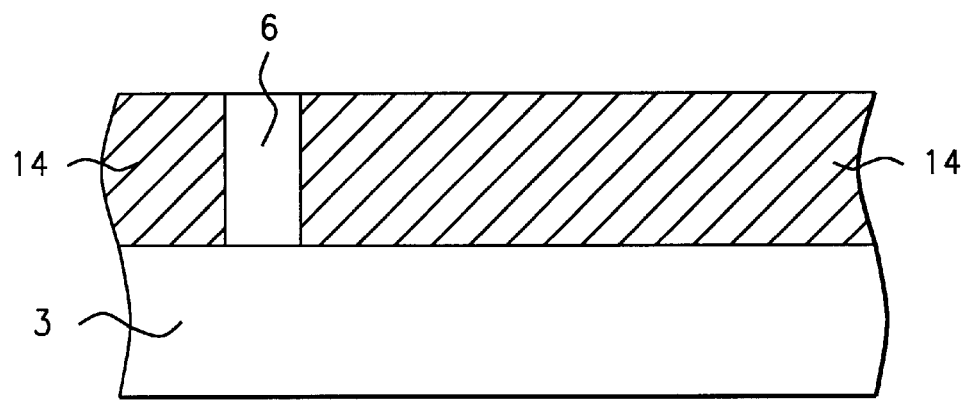

FIG. 6A, shows a top view of the copper inductor structure, where the shape of copper inductor structure 14, can be observed. Schematically shown in FIG. 6A, is the intersection of copper inductor structure 14, and sub-metal structure 5b, accomplished in opening 8. FIG. 6B, schematically shows a cross-sectional view of the copper inductor structure.

While this invention has been particularly shown and described with reference to, the preferred embodiments thereof, it will be understood by those skilled in the art that various in form and detail may be made without departing from the spirit and scope of this invention.

What is claimed is:

1. A method of integrating the fabrication of a thick, damascene type copper inductor structure completely inlaid in a dielectric layer, and of complimentary metal oxide semiconductor, (CMOS), devices, on a semiconductor substrate, comprising the steps of:

providing a CMOS device region, on a first region of said semiconductor substrate, to be used for said CMOS devices, and providing an inductor region, in a second region of said semiconductor substrate, to be used for said thick, copper inductor structure;

forming a first intermetal dielectric, (IMD), layer;

forming openings in said first IMD layer to expose underlying conductive regions in said CMOS device region, and to expose underlying conductive regions in said inductor region;

forming a first sub-metal structure, on said first IMD layer, in said CMOS device region, with said first sub-metal structure contacting said underlying conductive regions, in said openings in said first IMD layer, and forming a second sub-metal structure, on said first IMD layer, in said inductor region;

depositing a second IMD layer;

forming a first photoresist shape, on said second IMD layer, with an opening in said first photoresist shape exposing a portion of the top surface of said second IMD layer, in said inductor region;

removing the region of said second IMD layer, exposed in said opening in said first photoresist shape, creating an inductor opening in said second IMD layer, exposing a portion of the top surface of said second sub-metal structure;

using a second photoresist shape as a mask to create damascene type openings in said second IMD layer, exposing portions of the top surface of said first sub-metal structure in said CMOS device region, with said second photoresist shape completely covering the portion of top surface of said second sub-metal structure exposed in said inductor opening;

removing said second photoresist shape and performing a post photoresist wet clean procedure;

forming a titanium nitride layer on top surface of said second sub-metal structure;

forming a thin copper layer via chemical vapor deposition (CVD), or via physical vapor deposition (PVD) procedures, on said titanium nitride layer;

depositing a thick copper layer via electro-chemical deposition (ECD) procedures, completely filling said inductor opening, in said inductor region, and completely filling said damascene type openings, in said CMOS device region; and removing regions of said thick copper layer from the top surface of said second IMD layer to form copper interconnect structures, in said damascene type openings, overlying and contacting said first sub-metal structure, in said CMOS region, and forming said thick, damascene type copper inductor structure, in said inductor opening, overlying and contacting, said second sub-metal structure, in said inductor region.

2. The method of claim 1, wherein said CMOS devices, are sub-0.18 um, devices, with channel lengths of 0.18 um, or less.

3. The method of claim 1, wherein said first IMD layer is comprised of either silicon oxide, or borophosphosilicate glass, obtained via LPCVD or PECVD procedures, at a thickness between about 6000 to 8000 Angstroms.

4. The method of claim 1, wherein said first sub-metal structure and said second sub-metal structure are formed from a metal layer such as copper, or from a metal layer selected from a group consisting of copper, aluminum, and tungsten, with the metal layer obtained via plasma vapor deposition, (PVD), or via chemical vapor deposition, (CVD), procedures, at a thickness between about 4000 to 5000 Angstroms.

5. The method of claim 1, wherein said first sub-metal structure, and said second sub-metal structure, are defined via an anisotropic RIE procedure, using $Cl_2$ as an etchant.

6. The method of claim 1, wherein said second IMD layer is comprised of either silicon oxide, or borophosphosilicate glass, obtained via LPCVD or PECVD procedures, at a thickness between about 7000 to 7600 Angstroms.

7. The method of claim 1, wherein said inductor opening is formed in said second IMD layer via a selective, anisotropic RIE procedure, using $CHF_3$ as an etchant, with an etch rate selectivity of said second IMD layer, to underlying, said second sub-metal structure, of greater than 10 to 1.

8. The method of claim 1, wherein said copper layer, used for said inductor structure, and for said copper interconnect structures, is obtained via said electro-chemical deposition at a thickness between about 8000 to 8500 Angstroms.

9. The method of claim 1, wherein said inductor structure, is formed in said inductor opening, and wherein said copper interconnect structures are formed in said damascene type openings, via removal of said copper layer from the top surface of said second IMD layer, via a chemical mechanical polishing procedure.

* * * * *